(12) United States Patent  
Im et al.

(10) Patent No.: US 7,298,177 B1
(45) Date of Patent: Nov. 20, 2007

(54) METHOD AND MECHANISM TO DETERMINE KEEPER SIZE

(75) Inventors: Yonghee Im, Pleasanton, CA (US); Yong Qin, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 142 days.

(21) Appl. No.: 11/118,897

(22) Filed: Apr. 29, 2005

(51) Int. Cl.
*H03K 19/096* (2006.01)

(52) U.S. Cl. .......................................... 326/121; 326/98

(58) Field of Classification Search ................. 326/121
See application file for complete search history.

(56) References Cited

U.S. PATENT DOCUMENTS

| | | | |
|---|---|---|---|
| 6,784,695 B1 * | 8/2004 | Yeager et al. ................... | 326/98 |
| 6,914,452 B2 * | 7/2005 | Gauthier et al. ............... | 326/98 |
| 2004/0076059 A1 * | 4/2004 | Khellah et al. ................ | 365/203 |
| 2004/0189347 A1 * | 9/2004 | Hsu et al. ...................... | 326/121 |
| 2006/0049850 A1 * | 3/2006 | Chu et al. ....................... | 326/98 |
| 2006/0132187 A1 * | 6/2006 | Tschanz et al. ................ | 326/95 |
| 2006/0214695 A1 * | 9/2006 | Lih et al. ........................ | 326/98 |

* cited by examiner

*Primary Examiner*—Rexford Barnie
*Assistant Examiner*—Thienvu Tran
(74) *Attorney, Agent, or Firm*—Bobby K. Truong; Hickman Palermo Troung & Becker LLP (57) ABSTRACT

A method and apparatus for determining the size of a keeper transistor in a dynamic circuit is provided. A first portion of a dynamic circuit, comprising the keeper transistor, is analyzed to determine keeper current data that describes what size the keeper transistor would need to be to supply a specified amount of keeper current. A second portion of the dynamic circuit is analyzed, separate from the first portion, to determine an estimated amount of leakage current that passes through the PDN when the PDN is not actively discharging the dynamic node may be determined. The size for the keeper transistor that enables the keeper transistor, when activated, to produce an amount of keeper current that is substantially equal to the estimated amount of leakage current may be determined based on the analysis performed on the first and second portion.

15 Claims, 7 Drawing Sheets

METHOD AND MECHANISM TO DETERMINE KEEPER SIZE

BACKGROUND

A dynamic circuit is a circuit whose output is triggered by a clock signal applied to the dynamic circuit. A dynamic circuit operates in two different modes, namely an evaluation mode and a pre-charge mode, depending on whether the value of the clock signal, applied to the dynamic circuit, has a logic high value (in other words, a "1") or a logic low value (in other words, a "0").

When the clock signal applied to the dynamic circuit has a logic high value, the dynamic circuit is in evaluation mode. In evaluation mode, the logic of the dynamic circuit is evaluated using the inputs to the dynamic circuit. Thus, when a dynamic circuit is in evaluation mode, the output of the dynamic circuit depends upon the evaluation of the logic of the dynamic circuit using the inputs applied to the dynamic circuit.

When the clock signal applied to the dynamic circuit has a logic low value, the dynamic circuit is in pre-charge mode. In pre-charge mode, the logic of the dynamic circuit is not evaluated. The output of a dynamic circuit in pre-charge mode is driven to a logical low value, since the logic of the dynamic circuit is not being evaluated.

Figure 1A:
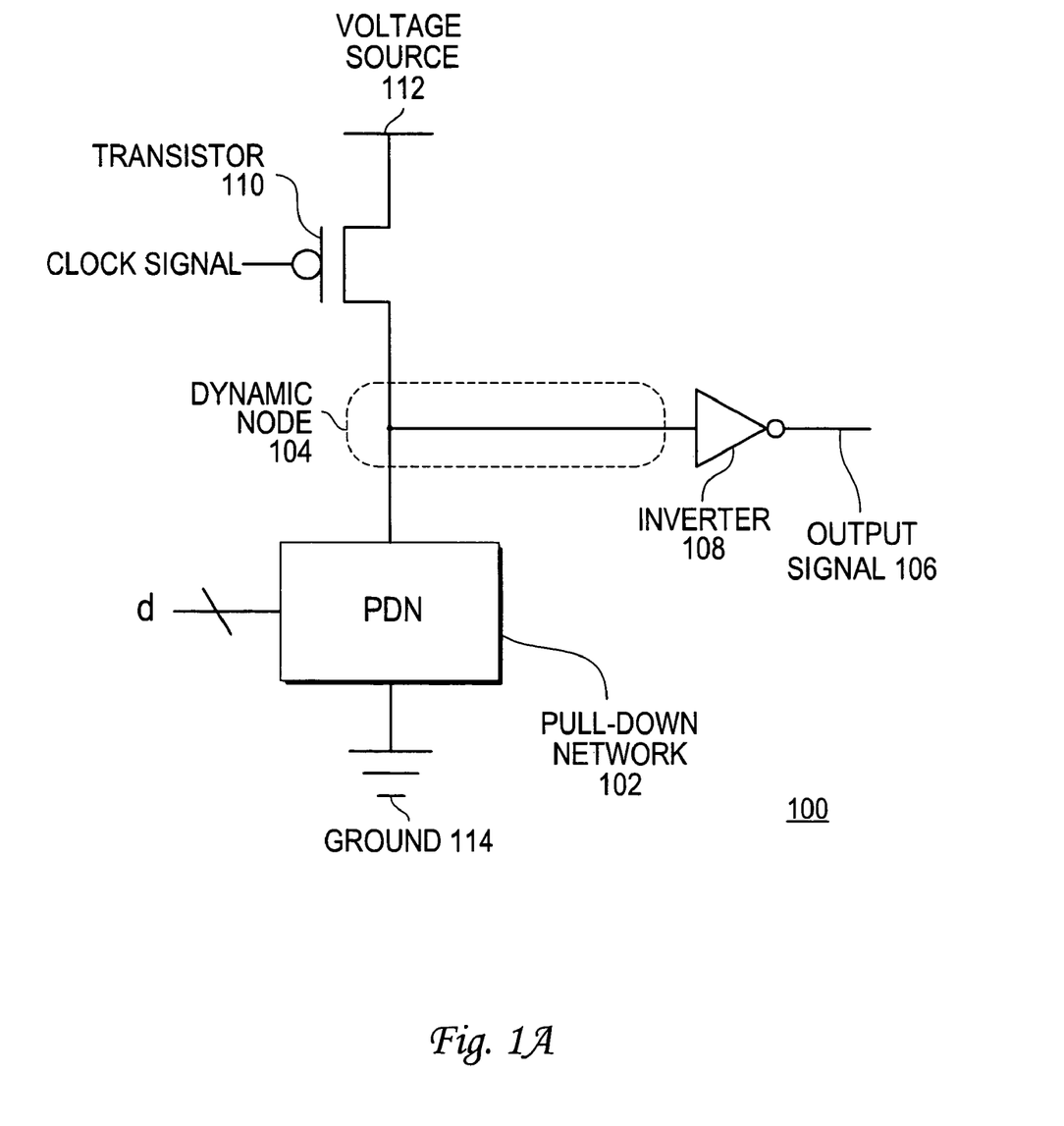
FIG. 1A is an illustration of a first illustrative dynamic circuit.
Figure 1B:
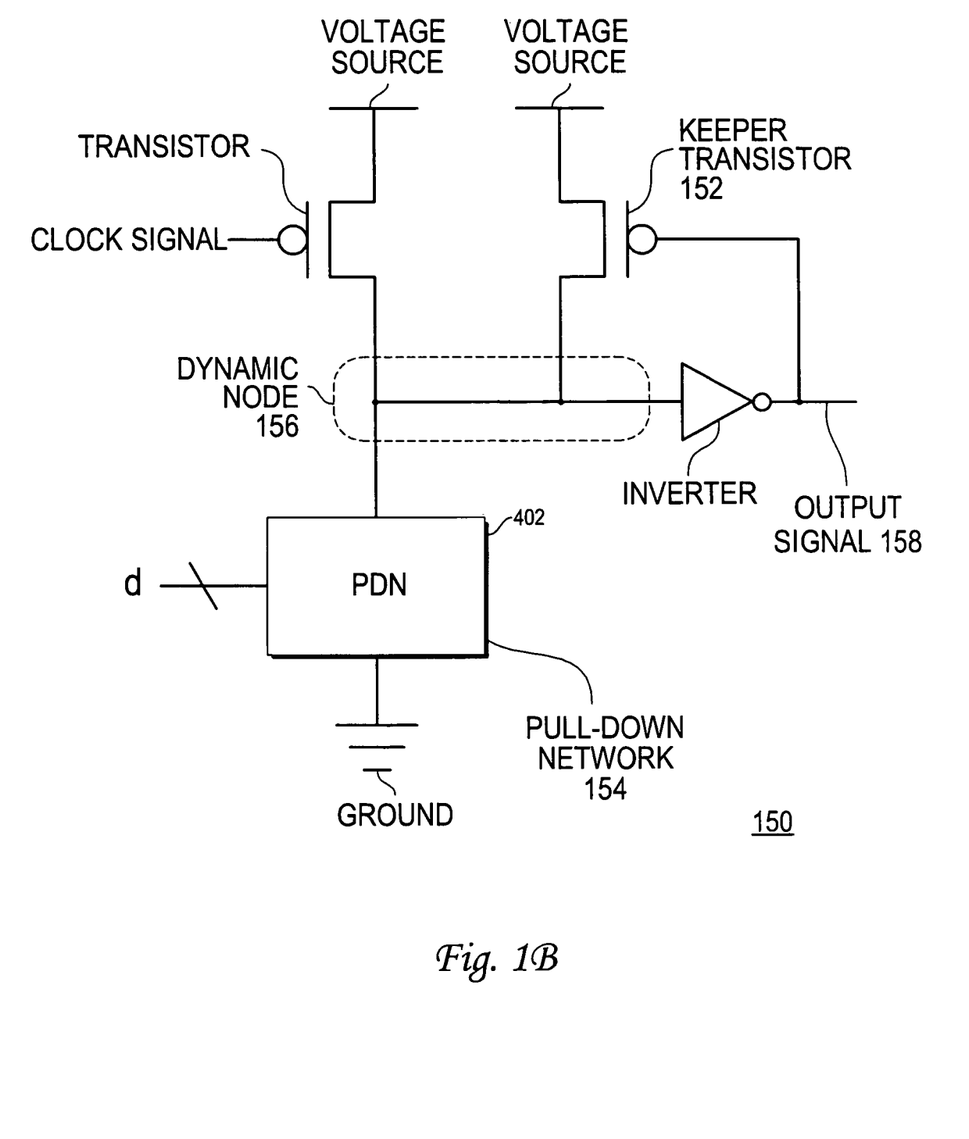
FIG. 1B is an illustration of a second illustrative dynamic circuit.

FIGS. 1A and 1B are both illustrations of illustrative dynamic circuits. When the dynamic circuit 100 of FIG. 1A is in pre-charge mode, the clock signal will have a logic low value. As a result, the dynamic node 104 will be driven to a logic high value because the transistor 110 will be turned on, thereby coupling the dynamic node 104 to voltage source 112. This causes the output signal 106 of the dynamic circuit 100 to be driven to a logic low value (due to inverter 108).

During the evaluation mode of the dynamic circuit 100, the clock signal will have a logic high value, which turns off transistor 110. Since transistor 110 is turned off, the dynamic node 104 is not connected to voltage source 112 when the dynamic circuit 100 is in evaluation mode.

If, during evaluation mode, the logic of the pull down network (PDN) 102 is evaluated to a logic high, the PDN 102 will discharge the dynamic node 104 and pull the voltage of the dynamic node 104 down to a logic low voltage (to ground). This causes the output signal 106 of the dynamic circuit 100 to have a logic high value due to inverter 108.

On the other hand, if during evaluation mode, the PDN 102 is not evaluated to a logic high value, then the PDN 102 will not drive the dynamic node 104 to a logic low voltage since the dynamic node 104 will not be connected to ground 114. Rather, the PDN 102 simply leaves the voltage of the dynamic node 104 as is. The charge that was imposed on the dynamic node 104 during the pre-charge mode is relied upon to keep the dynamic node 104 at a logic high level. When the voltage of the dynamic node 104 has a logic high value, the output of the dynamic circuit 100 has a logic low value because of inverter 108. As the above discussion shown, when the dynamic circuit is in evaluation mode and the PDN 102 is evaluated as having a logic low value, nothing is driving the dynamic node 104. Thus, under these conditions, the dynamic node 104 is a floating node.

While the dynamic node 104 is a floating node, current may leak from the dynamic node 104 through the PDN 102. If enough current leaks from the dynamic node 104 through the PDN 102, the resulting reduction in the charge of the dynamic node 104 may cause the dynamic node 104 to cross over from a logic high level to a logic low level. This would, in turn, cause the output of the dynamic circuit to change from having a logic low value to a logic high value. If this happens, a logical failure results because the output signal 106 should have been a logic low value.

The keeper transistor 152 of FIG. 1B prevents this situation from occurring in dynamic circuit 150. As shown in FIG. 1B, if the PDN 154 does not discharge the dynamic node 156, then the dynamic node 156 will retain a logical high voltage due to the keeper transistor 152, and the output signal 158 of the dynamic circuit will remain at logic low voltage. When the keeper transistor 152 is turned on (as is the case when the output signal 158 has a logic low value), the keeper transistor 152 provides an amount of current to the dynamic node 156 to compensate the current leaking from the dynamic node 156. Thus, the keeper transistor 152 serves to retain the pre-charged voltage level at the dynamic node 156 of dynamic circuit 150 when the dynamic circuit 150 is in evaluation mode.

The size of the transistor can directly impact the delay of the circuit. Thus, it is desirable to use a keeper transistor whose size is large enough that the keeper transistor provides enough current to the dynamic node to compensate for the current leaking from the dynamic node, but not so large as to unduly slow down the evaluation of the dynamic circuit, as larger keeper transistors require additional time to transition from being turned on and off.

Traditionally, to determine the size of a keeper transistor, an arbitrary initial size is chosen by a circuit designer for the keeper transistor. The initial size of the keeper transistor may be based on the size of the keeper transistor that the circuit designer feels is a good starting point based on the experience of the circuit designer in view of the characteristics of the dynamic circuit. After selecting the initial size of the keeper transistor, the circuit designer may perform a simulation of the dynamic circuit using the initial selected keeper transistor size to ensure that the selected size of the keeper transistor causes the dynamic circuit to perform within a specified set of requirements, such as a requirement that the voltage level of the dynamic node remains at some specified level when the dynamic circuit is in the evaluation mode.

If a chosen size of the keeper transistor does not perform as expected, then the circuit designer may fine-tune the size of the keeper transistor by (a) choosing a new size of the keeper transistor and (b) performing another simulation of the dynamic circuit using the new size of the keeper transistor. The circuit designer may repeat these steps as necessary to ensure that the chosen size of the keeper transistor causes the dynamic circuit to perform within a specified set of requirements. Unfortunately, such an approach requires numerous iterations.

SUMMARY

Techniques are provided for an efficient approach for determining the size of a keeper transistor in a dynamic circuit. Embodiments of the invention operate under the recognition that such an efficient approach may be performed by analyzing the simulated behavior of each of a first portion of the dynamic circuit, comprising a keeper transistor, and a second portion of the dynamic circuit, comprising a PDN and a pre-charge transistor, separate from each other. After analyzing each of the first portion and the second portion of the dynamic circuit separately from each other, a size for the keeper transistor that enables the keeper transistor, when activated, to produce an amount of keeper current that is substantially equal to the estimated amount of current leaking from the dynamic node may be determined.

In one embodiment, initially the first portion of the dynamic circuit is analyzed to determine keeper current data that describes what size the keeper transistor would need to be to supply a specified amount of keeper current. Thereafter, the second portion of the dynamic circuit is analyzed, separate from the first portion of the dynamic circuit, to determine characteristics of components in the second portion, e.g., an estimated amount of leakage current that passes through the PDN when the PDN is not actively discharging the dynamic node may be determined.

After analyzing the first portion and the second portion separately, the size for the keeper transistor that enables the keeper transistor, when activated, to produce an amount of keeper current that is substantially equal to the estimated amount of leakage current may be determined based on the analysis performed on the second portion of the dynamic circuit and the keeper current data. For example, the size of the keeper transistor may be determined by using the keeper current data to identify what size the keeper transistor would need to be to supply an amount of keeper current substantially equal to the estimated amount of leakage current.

BRIEF DESCRIPTION OF THE DRAWINGS

The embodiments of invention described herein are illustrated by way of example, and not by way of limitation, in the figures of the accompanying drawings and in which like reference numerals refer to similar elements and in which.

DETAILED DESCRIPTION OF EMBODIMENT(S)

In the following description, for the purposes of explanation, numerous specific details are set forth in order to provide a thorough understanding of the embodiments of invention described herein. It will be apparent, however, that the embodiments of invention described herein may be practiced without these specific details. In other instances, well-known structures and devices are shown in block diagram form in order to avoid unnecessarily obscuring the embodiments of invention described herein.

Functional Overview

Embodiments of the invention advantageously provide an efficient approach for determining the size of a keeper transistor in a dynamic circuit. Embodiments of the invention operate under the recognition that such an efficient approach may be performed by analyzing the simulated behavior of each of a first portion of the dynamic circuit, comprising a keeper transistor, and a second portion of the dynamic circuit, comprising a PDN and a pre-charge transistor, separate from each other. After analyzing each of the first portion and the second portion of the dynamic circuit separately from each other, a size for the keeper transistor that enables the keeper transistor, when activated, to produce an amount of keeper current that is substantially equal to the estimated amount of current leaking from the dynamic node may be determined.

In one embodiment, initially the first portion of the dynamic circuit is analyzed to determine keeper current data. Keeper current data is data that describes what size the keeper transistor would need to be to supply a specified amount of keeper current (which is current flowing through the keeper transistor when the keeper transistor is turned on). Since the amount of current supplied by a transistor is substantially proportional to its size, keeper current data for a large set of keeper transistor sizes may be extrapolated from keeper current data for a smaller set of keeper transistor sizes. This step is performed by analyzing the keeper transistor of a dynamic circuit separate from the PDN and pre-charge transistor of the dynamic circuit. Note that this step be omitted if keeper current data is already obtained or otherwise available.

Thereafter, the second portion of the dynamic circuit may be analyzed separate from the first portion of the dynamic circuit to determine characteristics of components in the second portion. For example, an estimated amount of leakage current that passes through the PDN when the pre-charge transistor is not pre-charging the dynamic node and the PDN is not actively discharging the dynamic node may be determined.

After analyzing the first portion and the second portion separately, the size for the keeper transistor that enables the keeper transistor, when activated, to produce an amount of keeper current that is substantially equal to the estimated amount of leakage current may be determined based on the analysis performed on the second portion of the dynamic circuit and the keeper current data. For example, the size of the keeper transistor may be determined by using the keeper current data to identify what size the keeper transistor would need to be to supply an amount of keeper current substantially equal to the estimated amount of leakage current.

A keeper transistor-sizing tool, which is a software program capable of simulating the operation of circuits, may be used to perform one or more of the above-described steps. Having described the high-level functional steps performed by an embodiment of the invention to determine the size of a keeper transistor, additional embodiments of the invention shall now be presented in greater detail.

Determining Keeper Current Data

Figure 2:
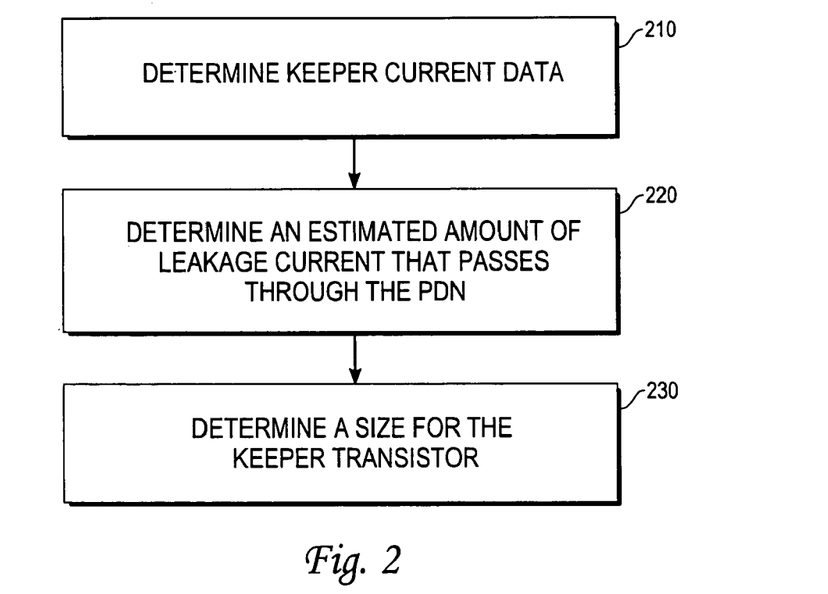
FIG. 2 is a flowchart illustrating the steps of determining the size of a keeper transistor according to an embodiment of the invention.

FIG. 2 is a flowchart illustrating the functional steps of determining the size of a keeper transistor according to an embodiment of the invention. In an embodiment of the invention, the functional steps of FIG. 2 may be performed by a keeper transistor-sizing tool, which is explained in further detail below. As explained in more detail below, steps 210 and 220 each analyze a different portion of a dynamic circuit independently from one another, while in step 230, the results of steps 210 and 220 are used in conjunction to determine the size of the keeper transistor.

Figure 3:
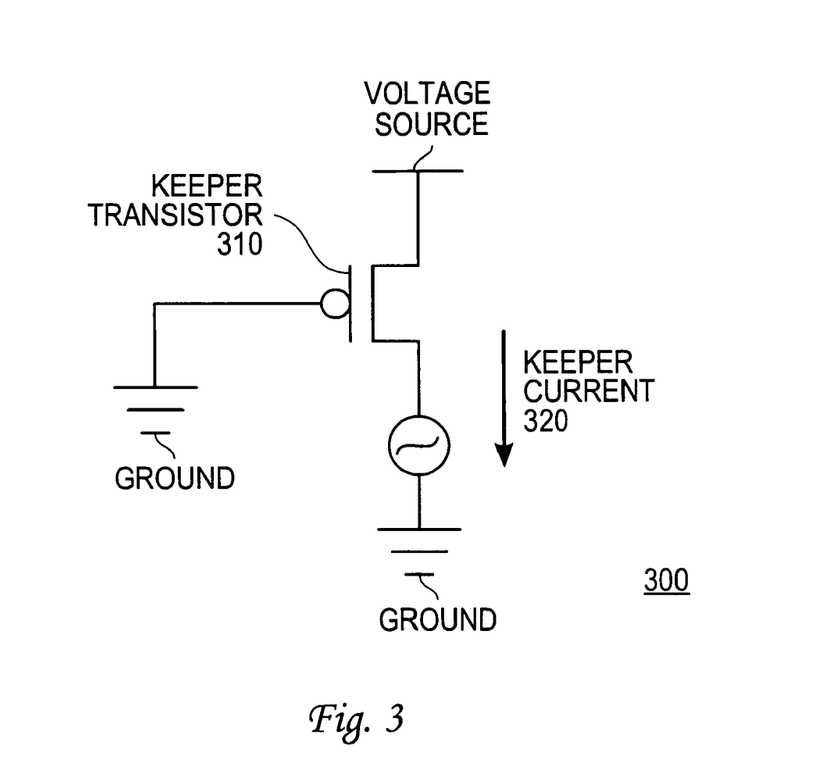
FIG. 3 is an illustration of a first portion of a dynamic circuit, which includes a keeper transistor, according to an embodiment of the invention.

Initially, in step 210, keeper current data is determined. FIG. 3 is an illustration of a first portion 300 of a dynamic circuit, which includes a keeper transistor 310, according to an embodiment of the invention. The performance of step 210 may be performed by generating keeper current data for the keeper transistor 310 of FIG. 3. Keeper current data is data that describes what size the keeper transistor 310 would need to be to supply a specified amount of keeper current 320.

Since the amount of current supplied by a transistor is substantially proportional to its size, keeper current data for a large set of keeper transistor sizes may be extrapolated from keeper current data for a smaller set of keeper transistor sizes. Thus, keeper current data may be generated by performing a simulation of the circuit of FIG. 3 for a small number of sizes of keeper transistor 310 to determine the amount of keeper current 320 produced by each size, and thereafter interpolating the data to determine the amount of keeper current 320 produced by other sizes of keeper transistor 310 not directly simulated.

Figure 4:
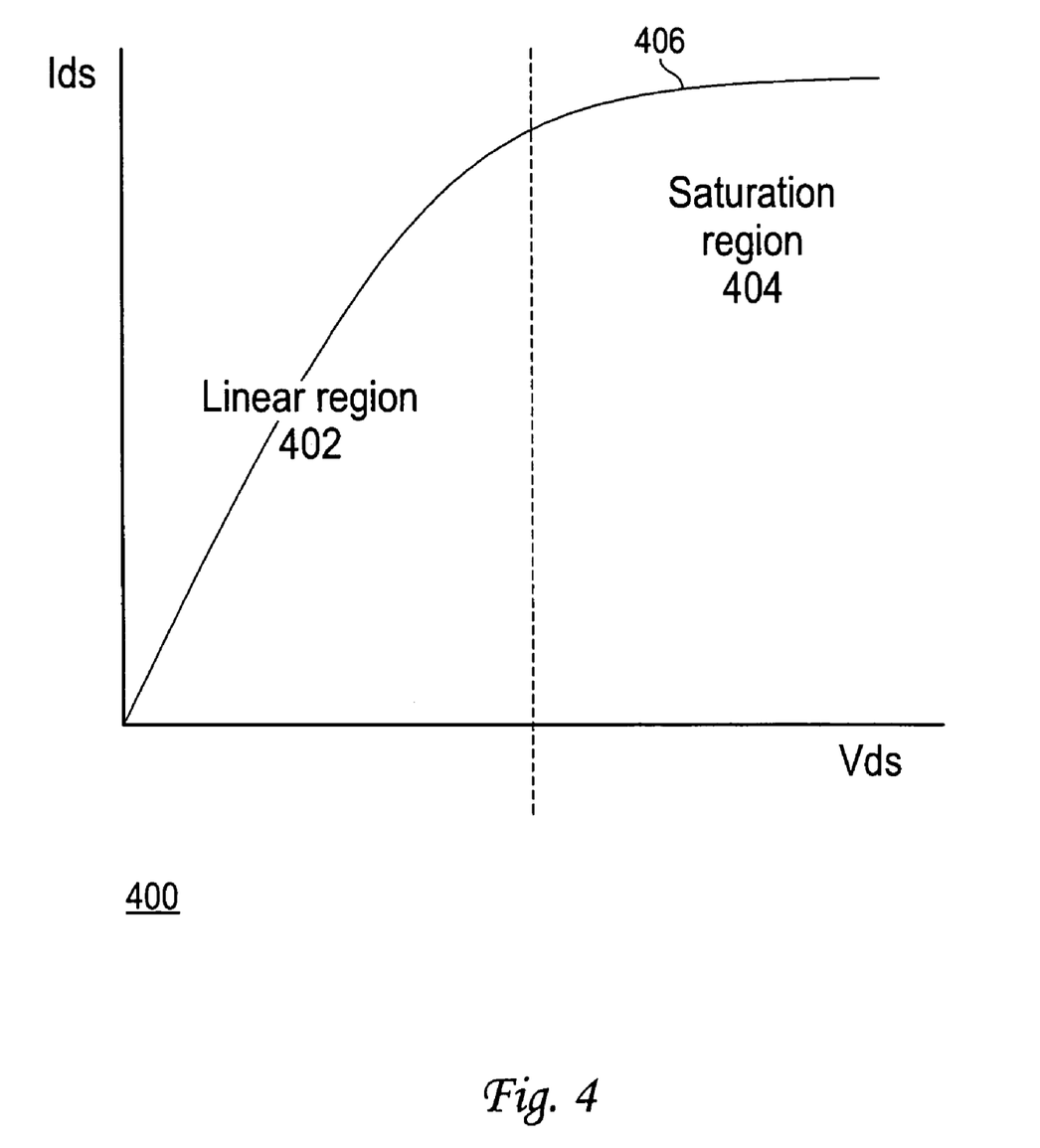
FIG. 4 is an illustration of keeper current data according to an embodiment of the invention.

Keeper current data may be represented in a variety of formats. In one embodiment of the invention, keeper current data may be represented in a graphical format. FIG. 4 is an illustration 400 of keeper current data, represented in a graphical format, according to an embodiment of the invention. Keeper current may also be referred to as the "saturation current" of the keeper transistor 310 since the keeper current 320 refers to the current when the operation of the keeper transistor 310 enters into the saturation region 404. Once the operation of the keeper transistor 310 enters into the saturation region 404, the amount of keeper current 320 supplied by the keeper transistor 310 is roughly proportional to the width of the keeper transistor 310. Thus, once a set of points on the curve 406 is identified, the position of the curve 406, in its entirety in the saturation region 404, may be determined or predicted.

In another embodiment of the invention, keeper current data may be represented in a tabular format comprising a plurality of records, and each record describes a particular size of a keeper transistor with a particular amount of keeper current that is provided by a keeper transistor of the particular size when the particular keeper transistor is turned on.

In an embodiment of the invention, the performance of step 210 is optional. Step 210 may be omitted if keeper current data is already obtained or otherwise available. For example, as the amount of current supplied by any transistor is substantially proportional to its size, keeper current data may already be known for the characteristics of the dynamic circuit without analyzing keeper transistor 310. After the keeper current data has been obtained, processing proceeds to step 220.

Determining an Estimated Amount of Leakage Current

Figure 5:
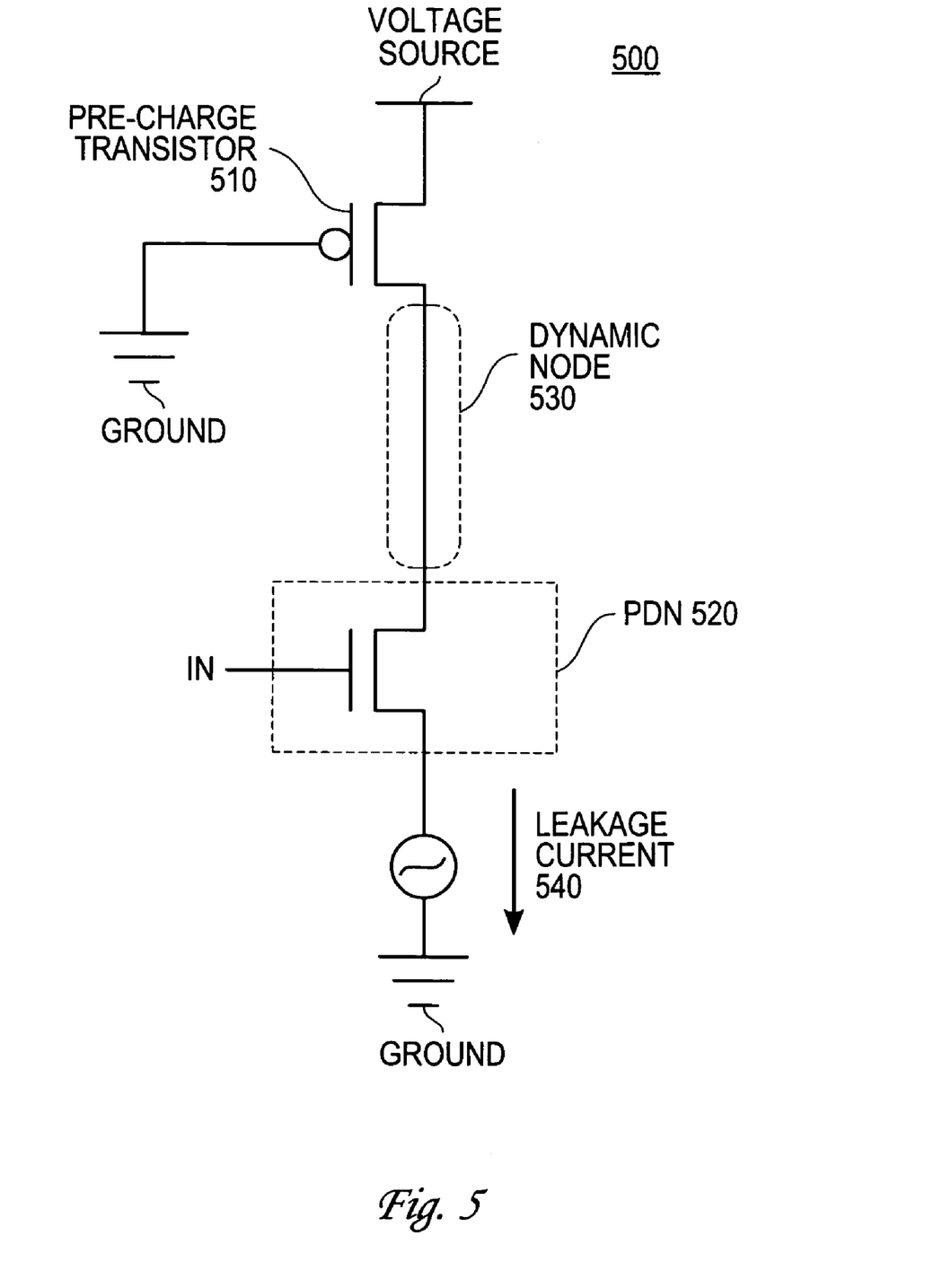
FIG. 5 is an illustration of a second portion of a dynamic circuit, which includes a PDN and a pre-charge transistor, according to an embodiment of the invention.

In step 220, an estimated amount of leakage current that passes through the PDN is determined. FIG. 5 is an illustration of a second portion 500 of a dynamic circuit, which includes a PDN 520 and a pre-charge transistor 510, according to an embodiment of the invention. Step 220 may be performed by analyzing the characteristics of the circuit portion 500 shown in FIG. 5. In an embodiment, the analysis performed in step 220 is performed by analyzing only those components depicted in FIG. 5, e.g., the keeper transistor plays no parts in the analysis of step 220.

In an embodiment of the invention, step 220 is performed by performing an operating simulation on partial circuit 500. The simulation simulates behavior of the partial circuit 500 when the PDN 520 is not actively discharging the dynamic node 530. The estimated amount of leakage current 540 that passes through the PDN 520 may be obtained from a set of simulation results.

In an embodiment of the invention, for purposes of the simulation performed in step 520, the voltage associated with dynamic node 530 is assumed to be equivalent to the voltage associated with a logic high voltage. A logic high voltage is the maximum voltage associated with Vcc, or the power source. For example, if Vcc supplies 1 volt, then the logic high voltage is 1 volt. In reality, the dynamic node 530 may have a voltage less than 100% of a logic high voltage (such as 0.95 volts), while still being evaluated to a logic high value. As explained in further detail below, assuming the dynamic node 530 is associated with a logic high voltage guarantees that, as a result of performing the steps of FIG. 2, the keeper transistor size, determined in step 230, is the maximum size for the keeper transistor, although the size of the keeper transistor may be reduced for reasons discussed hereafter.

After the estimated amount of leakage current 540 that passes through the PDN 520 is determined in step 220, processing proceeds to step 230.

Determining the Size of the Keeper Transistor

In step 230, a size for the keeper transistor is determined. The performance of step 230 will be discussed with reference to FIG. 6, which is an illustration of a dynamic circuit 600 according to an embodiment of the invention.

Figure 6:
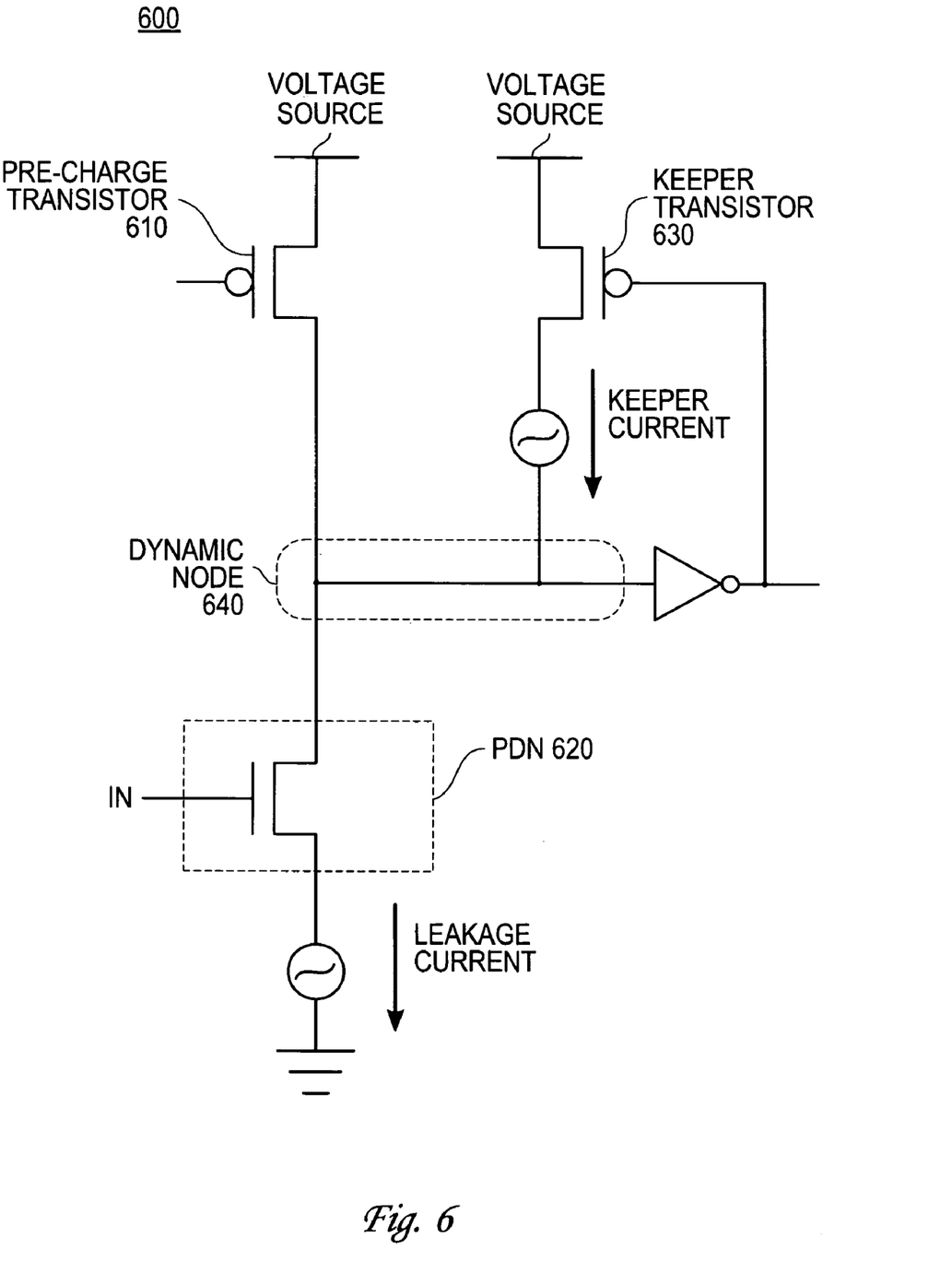
FIG. 6 is an illustration of a dynamic circuit according to an embodiment of the invention.

In an embodiment of the invention, a representation of a dynamic circuit 600 is generated by combining the first circuit portion of FIG. 3 with the second circuit portion of FIG. 5. The combined dynamic circuit 600 includes (a) pre-charge transistor 610, (b) the PDN 620, and (c) the keeper transistor 630, each of which is coupled to the dynamic node 640, as shown in FIG. 6. The size of the keeper transistor 630 is determined in step 230 by ascertaining, using the keeper current data obtaining in step 210, which size of the keeper transistor 630 is needed to supply an amount of keeper current that is substantially equal to the estimated amount of leakage current that passes through the PDN 620 when the pre-charge transistor 610 is not pre-charging the dynamic node 640 and the PDN 620 is not actively discharging the dynamic node 640.

Advantageously, by performing the steps of FIG. 2, embodiments of the invention provide a systematic approach for determining, in a single pass of analyzing a dynamic circuit, the optimal size of the keeper transistor if the voltage level of the dynamic node is at 100% of a logic high voltage. As explained below, additional embodiments of the invention may be used to provide a systematic approach for determining, in one or more passes of analyzing a dynamic circuit, the optimal size of the keeper transistor if the voltage level of the dynamic node is not 100% of a logic high voltage.

Multi-Pass Approach

If the voltage level of the dynamic node is assumed to be 100% of a logic high voltage in step 220, then the performance of step 230 will yield the most conservative size (i.e., largest) of the keeper transistor. In reality, the dynamic node may have a voltage less than 100% of a logic high voltage, while still being evaluated to a logic high value. As a result, embodiments of the invention may perform one or more additional passes to reduce the size of the keeper transistor based, at least in part, on an acceptable level of voltage loss at the dynamic node.

For example, assume that conditions of a dynamic circuit are such that it is acceptable for the dynamic node to lose 5% of its voltage while still operating within a margin of safety. In other words, when the dynamic circuit is in evaluation mode, if the PDN does not discharge the dynamic node, it is permissible for the voltage level at the dynamic node to drop to 95% of a logic high voltage without danger of the dynamic node not being evaluated as having a logic high value. In such as case, the size of the keeper transistor 630 may be reduced to account for the acceptable level of voltage loss at the dynamic node. After reducing the size of the keeper transistor 630, additional simulations of the dynamic circuit 600 may be performed, using the reduced size of the keeper transistor 630, to ensure the reduced size of the keeper transistor 630 operates within acceptable parameters.

Alternatively, the acceptable level of voltage loss may be factored into the performance of step 220. For example, in the performance of step 220, instead of assuming that the voltage at the dynamic node is 100% of the logic high voltage, the voltage at the dynamic node may be assumed to be a lower level to reflect the acceptable level of voltage loss at the dynamic node. For example, in performing step 220, instead of assuming the dynamic node has a voltage level associated with a logic high voltage, the estimated amount of leakage current that passes through the PDN may be determined assuming the dynamic node has a voltage level 95% of a logic high voltage.

Keeper Transistor Sizing Tool

An administrator may use a keeper transistor-sizing tool to perform one or more of the steps depicted in FIG. 2. In an embodiment of the invention, a keeper transistor-sizing tool may be implemented as a set of instructions executing on a computer system accessible to the administrator.

Figure 7:
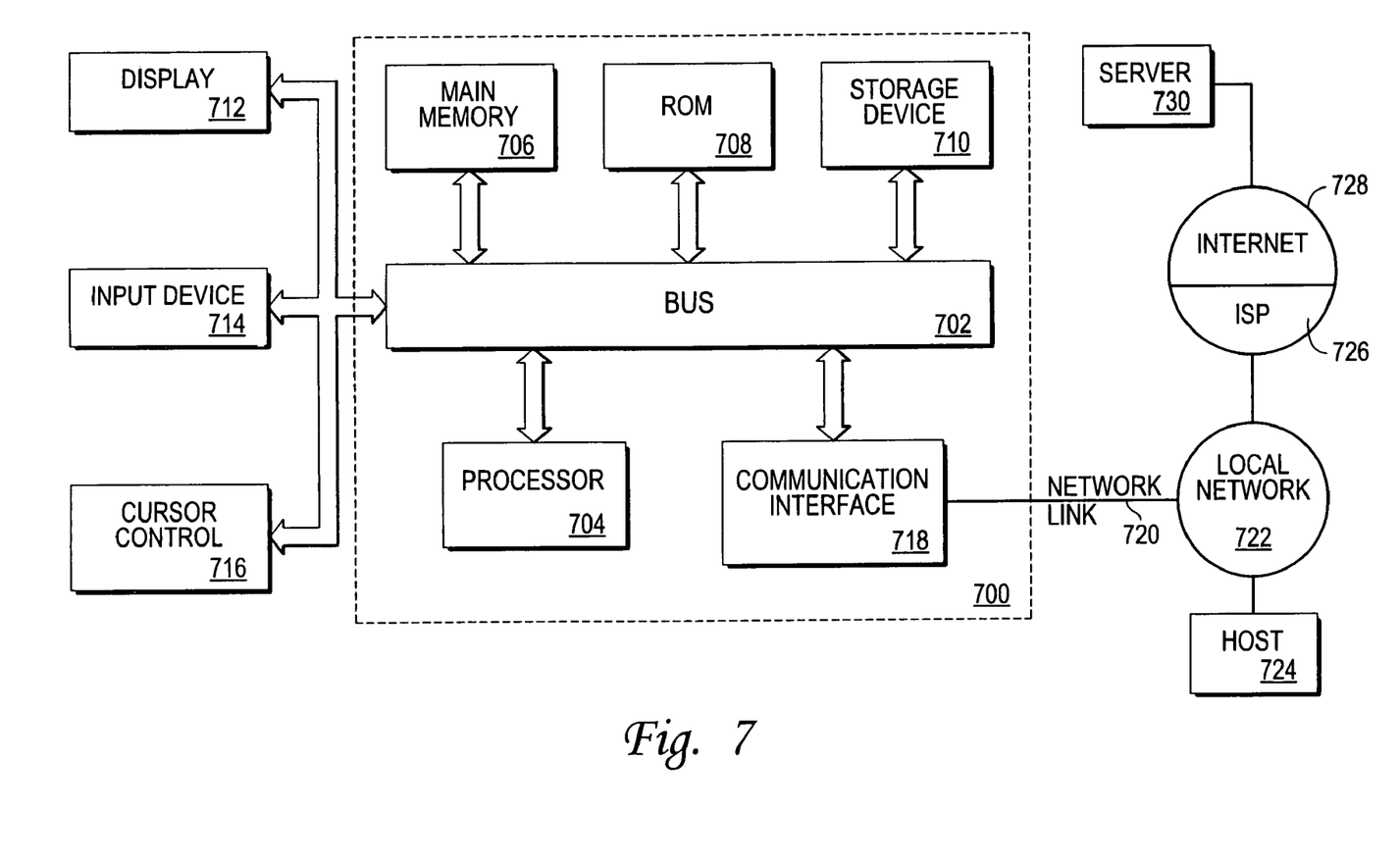
FIG. 7 is a block diagram that illustrates a computer system upon which an embodiment of the invention may be implemented.

FIG. 7 is a block diagram that illustrates a computer system 700 upon which an embodiment of the invention may be implemented. Computer system 700 includes a bus 702 or other communication mechanism for communicating information, and a processor 704 coupled with bus 702 for processing information. Computer system 700 also includes a main memory 706, such as a random access memory (RAM) or other dynamic storage device, coupled to bus 702 for storing information and instructions to be executed by processor 704. Main memory 706 also may be used for storing temporary variables or other intermediate information during execution of instructions to be executed by processor 704. Computer system 700 further includes a read only memory (ROM) 708 or other static storage device coupled to bus 702 for storing static information and instructions for processor 704. A storage device 710, such as a magnetic disk or optical disk, is provided and coupled to bus 702 for storing information and instructions.

Computer system 700 may be coupled via bus 702 to a display 712, such as a cathode ray tube (CRT), for displaying information to a computer user. An input device 714, including alphanumeric and other keys, is coupled to bus 702 for communicating information and command selections to processor 704. Another type of user input device is cursor control 716, such as a mouse, a trackball, or cursor direction keys for communicating direction information and command selections to processor 704 and for controlling cursor movement on display 712. This input device typically has two degrees of freedom in two axes, a first axis (e.g., x) and a second axis (e.g., y), that allows the device to specify positions in a plane.

The invention is related to the use of computer system 700 for implementing the techniques described herein. According to one embodiment of the invention, those techniques are performed by computer system 700 in response to processor 704 executing one or more sequences of one or more instructions contained in main memory 706. Such instructions may be read into main memory 706 from another machine-readable medium, such as storage device 710. Execution of the sequences of instructions contained in main memory 706 causes processor 704 to perform the process steps described herein. In alternative embodiments, hard-wired circuitry may be used in place of or in combination with software instructions to implement the invention. Thus, embodiments of the invention are not limited to any specific combination of hardware circuitry and software.

The term "machine-readable medium" as used herein refers to any medium that participates in providing data that causes a machine to operation in a specific fashion. In an embodiment implemented using computer system 700, various machine-readable media are involved, for example, in providing instructions to processor 704 for execution. Such a medium may take many forms, including but not limited to, non-volatile media, volatile media, and transmission media. Non-volatile media includes, for example, optical or magnetic disks, such as storage device 710. Volatile media includes dynamic memory, such as main memory 706. Transmission media includes coaxial cables, copper wire and fiber optics, including the wires that comprise bus 702. Transmission media can also take the form of acoustic or light waves, such as those generated during radio-wave and infra-red data communications.

Common forms of machine-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of machine-readable media may be involved in carrying one or more sequences of one or more instructions to processor 704 for execution. For example, the instructions may initially be carried on a magnetic disk of a remote computer. The remote computer can load the instructions into its dynamic memory and send the instructions over a telephone line using a modem. A modem local to computer system 700 can receive the data on the telephone line and use an infra-red transmitter to convert the data to an infra-red signal. An infra-red detector can receive the data carried in the infra-red signal and appropriate circuitry can place the data on bus 702. Bus 702 carries the data to main memory 706, from which processor 704 retrieves and executes the instructions. The instructions received by main memory 706 may optionally be stored on storage device 710 either before or after execution by processor 704.

Computer system 700 also includes a communication interface 718 coupled to bus 702. Communication interface 718 provides a two-way data communication coupling to a network link 720 that is connected to a local network 722. For example, communication interface 718 may be an integrated services digital network (ISDN) card or a modem to provide a data communication connection to a corresponding type of telephone line. As another example, communication interface 718 may be a local area network (LAN) card to provide a data communication connection to a compatible LAN. Wireless links may also be implemented. In any such implementation, communication interface 718 sends and receives electrical, electromagnetic or optical signals that carry digital data streams representing various types of information.

Network link 720 typically provides data communication through one or more networks to other data devices. For example, network link 720 may provide a connection through local network 722 to a host computer 724 or to data equipment operated by an Internet Service Provider (ISP) 726. ISP 726 in turn provides data communication services through the world wide packet data communication network now commonly referred to as the "Internet" 728. Local network 722 and Internet 728 both use electrical, electromagnetic or optical signals that carry digital data streams. The signals through the various networks and the signals on network link 720 and through communication interface 718, which carry the digital data to and from computer system 700, are exemplary forms of carrier waves transporting the information.

Computer system 700 can send messages and receive data, including program code, through the network(s), network link 720 and communication interface 718. In the Internet example, a server 730 might transmit a requested code for an application program through Internet 728, ISP 726, local network 722 and communication interface 718.

The received code may be executed by processor 704 as it is received, and/or stored in storage device 710, or other non-volatile storage for later execution. In this manner, computer system 700 may obtain application code in the form of a carrier wave.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. For a dynamic circuit comprising a pre-charge circuit, a pull down network (PDN), and a keeper transistor, all of which are coupled to a dynamic node of the dynamic circuit, a machine-implemented method for determining a size for the keeper transistor, comprising:
   determining an estimated amount of leakage current that passes through the PDN when the PDN is not actively discharging the dynamic node, wherein determining the estimated amount of leakage current comprises:
      performing a computer simulation on a partial circuit that includes the pre-charge circuit and the PDN but not the keeper transistor, wherein the computer simulation simulates behavior of the partial circuit when the PDN is not actively discharging the dynamic node; and
      obtaining, from a set of simulation results, the estimated amount of leakage current that passes through the PDN; and
   determining a size for the keeper transistor that enables the keeper transistor, when activated, to produce an amount of keeper current that is substantially equal to the estimated amount of leakage current.

2. The method of claim 1, further comprising:
   after performing the step of determining the size of the keeper transistor, reducing the size of the keeper transistor based, at least in part, on an acceptable level of voltage loss at the dynamic node.

3. The method of claim 1, further comprising:
   accessing data that describes what size said keeper transistor would need to be to supply a specified amount of on current.

4. The method of claim 1, wherein the step of determining an estimated amount of leakage current comprises:
   assigning a logic high voltage to the dynamic node.

5. The method of claim 1, wherein the step of determining an estimated amount of leakage current comprises:
   assigning a voltage that is less than a logic high voltage to the dynamic node.

6. For a dynamic circuit comprising a pre-charge circuit, a pull down network (PDN), and a keeper transistor, all of which are coupled to a dynamic node of the dynamic circuit, a machine-readable storage medium carrying one or more sequences of instructions for determining a size for the keeper transistor, wherein execution of the one or more sequences of instructions by one or more processors causes the one or more processors to perform the steps of:
   determining an estimated amount of leakage current that passes through the PDN when the PDN is not actively discharging the dynamic node, wherein determining the estimated amount of leakage current comprises:
      performing a computer simulation on a partial circuit that includes the pre-charge circuit and the PDN but not the keeper transistor, wherein the computer simulation simulates behavior of the partial circuit when the PDN is not actively discharging the dynamic node; and
      obtaining, from a set of simulation results, the estimated amount of leakage current that passes through the PDN; and
   determining a size for the keeper transistor that enables the keeper transistor, when activated, to produce an amount of keeper current that is substantially equal to the estimated amount of leakage current.

7. The machine-readable storage medium of claim 6, wherein execution of the one or more sequences of instructions by the one or more processors causes the one or more processors to further perform the step of:
   after performing the step of determining the size of the keeper transistor, reducing the size of the keeper transistor based, at least in part, on an acceptable level of voltage loss at the dynamic node.

8. The machine-readable storage medium of claim 6, wherein execution of the one or more sequences of instructions by the one or more processors causes the one or more processors to further perform the step of:
   accessing data that describes what size said keeper transistor would need to be to supply a specified amount of on current.

9. The machine-readable storage medium of claim 6, wherein the step of determining an estimated amount of leakage current comprises:
   assigning a logic high voltage to the dynamic node.

10. The machine-readable storage medium of claim 6, wherein the step of determining an estimated amount of leakage current comprises:
   assigning a voltage that is less than a logic high voltage to the dynamic node.

11. For a dynamic circuit comprising a pre-charge circuit, a pull down network (PDN), and a keeper transistor, all of which are coupled to a dynamic node of the dynamic circuit, an apparatus for determining a size for the keeper transistor, comprising:

one or more processors; and a machine-readable medium, coupled to the one or more processors, carrying one or more sequences of instructions for determining a size for the keeper transistor, wherein execution of the one or more sequences of instructions by the one or more processors causes the one or more processors to perform the steps of:

determining an estimated amount of leakage current that passes through the PDN when the PDN is not actively discharging the dynamic node, wherein determining the estimated amount of leakage current comprises:

performing a computer simulation on a partial circuit that includes the pre-charge circuit and the PDN but not the keeper transistor, wherein the computer simulation simulates behavior of the partial circuit when the PDN is not actively discharging the dynamic node; and obtaining, from a set of simulation results, the estimated amount of leakage current that passes through the PDN; and determining a size for the keeper transistor that enables the keeper transistor, when activated, to produce an amount of keeper current that is substantially equal to the estimated amount of leakage current.

12. The apparatus of claim 11, wherein execution of the one or more sequences of instructions by the one or more processors further causes the one or more processors to perform the step of:

after performing the step of determining the size of the keeper transistor, reducing the size of the keeper transistor based, at least in part, on an acceptable level of voltage loss at the dynamic node.

13. The apparatus of claim 11, wherein execution of the one or more sequences of instructions by the one or more processors further causes the one or more processors to perform the step of:

accessing data that describes what size said keeper transistor would need to be to supply a specified amount of on current.

14. The apparatus of claim 11, wherein the step of determining an estimated amount of leakage current comprises:

assigning a logic high voltage to the dynamic node.

15. The apparatus of claim 11, wherein the step of determining an estimated amount of leakage current comprises:

assigning a voltage that is less than a logic high voltage to the dynamic node.

* * * * *